(12) United States Patent
Cheng et al.

(10) Patent No.: US 11,170,926 B2
(45) Date of Patent: Nov. 9, 2021

(54) ISOLATED COUPLING STRUCTURE

(71) Applicant: Alpha and Omega Semiconductor (Cayman) Ltd., Sunnyvale, CA (US)

(72) Inventors: Jung-Pei Cheng, Zhubei (TW); Hsiang-Chung Chang, Zhubei (TW); Yu-Ming Chen, Hsinchu (TW); Chieh-Wen Cheng, Hsinchu (TW); Tsung-Han Ou, Hsinchu (TW); Lih-Ming Doong, Zhunan Township (TW)

(73) Assignee: ALPHA AND OMEGA SEMICONDUCTOR (CAYMAN) LTD., Sunnyvale, CA (US)

( * ) Notice: Subject to any disclaimer, the term of this patent is extended or adjusted under 35 U.S.C. 154(b) by 636 days.

(21) Appl. No.: 15/887,418

(22) Filed: Feb. 2, 2018

(65) Prior Publication Data
US 2019/0172621 A1 Jun. 6, 2019

(30) Foreign Application Priority Data
Dec. 4, 2017 (CN) .......................... 201711257609.7

(51) Int. Cl.
*H01F 27/28* (2006.01)
*H01F 19/04* (2006.01)
(Continued)

(52) U.S. Cl.
CPC ......... *H01F 19/04* (2013.01); *H01F 27/2804* (2013.01); *H01F 27/29* (2013.01);
(Continued)

(58) Field of Classification Search
CPC .... H01F 5/003; H01F 17/006; H01F 17/0013; H01F 27/2804; H01F 2027/2809;
(Continued)

(56) References Cited

U.S. PATENT DOCUMENTS

| 4,253,079 A * | 2/1981 | Brosh | G01D 5/2046 336/136 |
| 5,532,667 A * | 7/1996 | Haertling | H01L 23/055 336/177 |

(Continued)

FOREIGN PATENT DOCUMENTS

| JP | 09330816 A * | 12/1997 | ............. H01L 24/73 |
| WO | WO-2010137090 A1 * | 12/2010 | ............. H01L 24/73 |
| WO | WO-2016132666 A1 * | 8/2016 | ........... H01F 27/323 |

*Primary Examiner* — Tszfung J Chan
(74) *Attorney, Agent, or Firm* — Chen-Chi Lin

(57) ABSTRACT

An isolation coupling structure for transmitting a feedback signal between a secondary side and a primary side of a voltage conversion device includes a first dielectric layer including a first face and a second face opposite to the first face, a first coupling coil disposed on the first face enclosing to form an inner region; a second coupling coil configured to couple with the first coupling coil. The second coupling coil includes a first coil portion and a second coil portion, where the first coil portion is disposed on the second face, the second coil portion is disposed on the first face and located inside the inner region. The second coil portion is isolated from the first coupling coil, and the first coil portion and the second coil portion are electrically connected. The technical effect is that it can realize the electrical isolation and the coupling with low cost and small package size.

16 Claims, 13 Drawing Sheets

(51) Int. Cl.
*H01L 25/065* (2006.01)
*H01F 27/29* (2006.01)
*H01L 23/58* (2006.01)

(52) U.S. Cl.
CPC .......... *H01L 23/58* (2013.01); *H01L 25/0655* (2013.01); *H01F 2027/2809* (2013.01)

(58) Field of Classification Search
CPC .. H01F 2027/2819; H01F 19/04; H01F 27/29; H01L 25/0655; H01L 23/58; H01L 23/5227; H01L 23/645
USPC .................................. 336/200, 232; 257/531
See application file for complete search history.

(56) References Cited

U.S. PATENT DOCUMENTS

| | | | |
|---|---|---|---|
| 7,973,635 B2 | 7/2011 | Baarman et al. | |
| 8,223,508 B2 | 7/2012 | Baarman et al. | |
| 8,592,944 B2 | 11/2013 | Santangelo et al. | |
| 8,963,622 B2 | 2/2015 | Lee et al. | |
| 9,368,271 B2* | 6/2016 | Li | H01F 27/29 |
| 9,576,711 B2 | 2/2017 | Yoon et al. | |
| 2008/0179963 A1* | 7/2008 | Fouquet | H01F 19/08 |
| | | | 307/104 |
| 2010/0001823 A1* | 1/2010 | Kawarai | H01F 17/0013 |
| | | | 336/200 |
| 2014/0374890 A1* | 12/2014 | Yamashita | H01L 23/5227 |
| | | | 257/670 |
| 2016/0358705 A1 | 12/2016 | Lin et al. | |
| 2016/0379744 A1* | 12/2016 | Vaesen | H01P 5/028 |
| | | | 336/170 |
| 2017/0148560 A1 | 5/2017 | Yoon et al. | |
| 2017/0171979 A1 | 6/2017 | Wang et al. | |

* cited by examiner

ISOLATED COUPLING STRUCTURE

CROSS-REFERENCE TO RELATED APPLICATIONS

This application claims the priority benefit of Chinese patent application number 201711257609.7 filed Dec. 4, 2017 by a common inventor of this Application. The entire Disclosure made in the Chinese patent application number 201711257609.7 is hereby incorporated by reference.

FIELD OF THE INVENTION

The present invention relates to a voltage signal transmission device, and more particularly, to an isolated coupling structure for transmitting feedback signals between secondary unit and primary unit on a voltage conversion device.

BACKGROUND OF THE INVENTION

AC-DC converters are necessary components for a variety of electronic devices. With the upgrading of technologies and the improvements in the performance of electronic devices, the industry demands higher requirements on the output precision of AC-DC converter, so that a secondary unit regulation scheme for precisely-controlled constant current and constant voltage is applied to AC-DC converters. For example, as shown in FIG. 1, which is a basic structure of a technical scheme disclosed by US Publication Number US 2016079877 A1, a second controller 102 is used to sense the output voltage or output current of the secondary side of a transformer used for power switching on a real-time basis and to generate the control signal of transient response; then a coupling element 103 is used to transmit the control signal generated by the second controller to the first controller 101 of the primary side; after that, the first controller 101 is used to generate the first pulse signal for power switching, thus controlling the turn-on/off of the winding in the primary unit and achieving the accurate output of constant current and constant voltage. The structure in FIG. 1 is only used to describe the state of the art, and that, for the convenience of understanding, the structure therein has been simplified.

In the above-mentioned secondary-side regulation scheme, a coupling element 103 capable of a fast isolation is required between the second controller 102 and the first controller 101 for the transmitting of control signal. However, in the existing scheme, the pulse transformer requires a relatively high cost and occupies relatively larger package dimensions, while the coupling capacitors are less stable due to their poor reliability.

SUMMARY OF THE INVENTION

Therefore, there is a need for a low cost coupling element having small package dimensions and better data integrity and device reliability. An isolated coupling structure comprises a first dielectric layer, a first coupling coil and a second coupling coil. The first dielectric layer comprises a first face and a second face opposite to the first face. The first coupling coil is formed on the first face surrounding an internal area of the first dielectric layer on the first face. The second coupling coil is configured to create a mutual inductance with the first coupling coil. The second coupling coil comprises a first coil part and a second coil part electrically connecting to the first coil part. The first coil part is formed on the second face. The second coil part is formed on the first face and is located within the internal area and is isolated from the first coupling coil.

DETAILED DESCRIPTION OF THE INVENTION

A detailed description of one or more embodiments of the invention is provided below along with accompanying figures that illustrate the principles of the invention. The invention is described in connection with such embodiments, but the invention is not limited to any embodiment.

Figure 2:
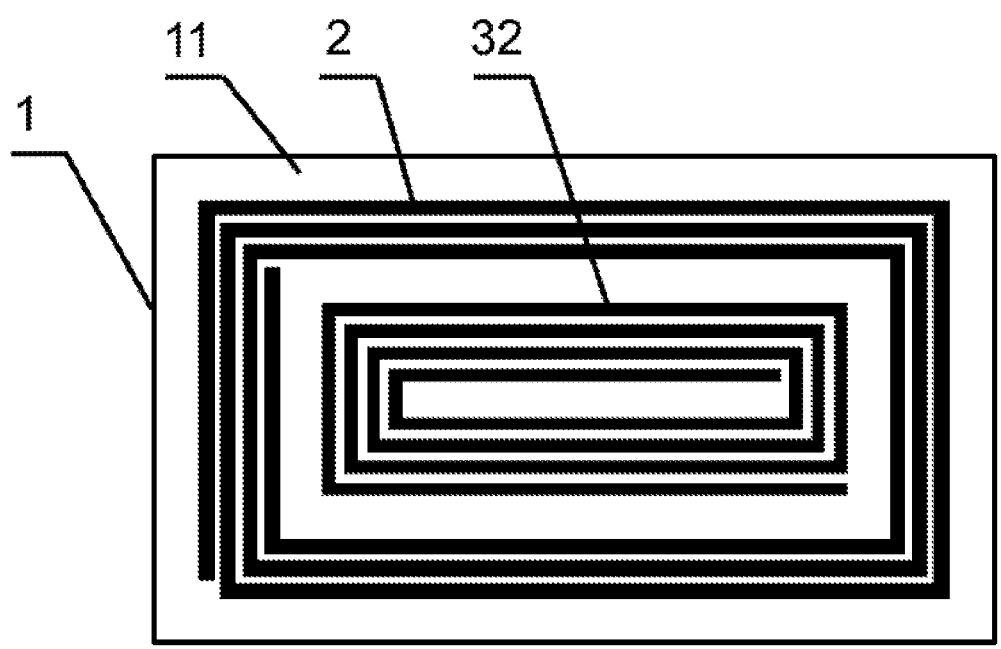
FIG. 2 is the schematic diagram showing the first face of the first dielectric layer of an isolated coupling structure of the present invention.
Figure 3:
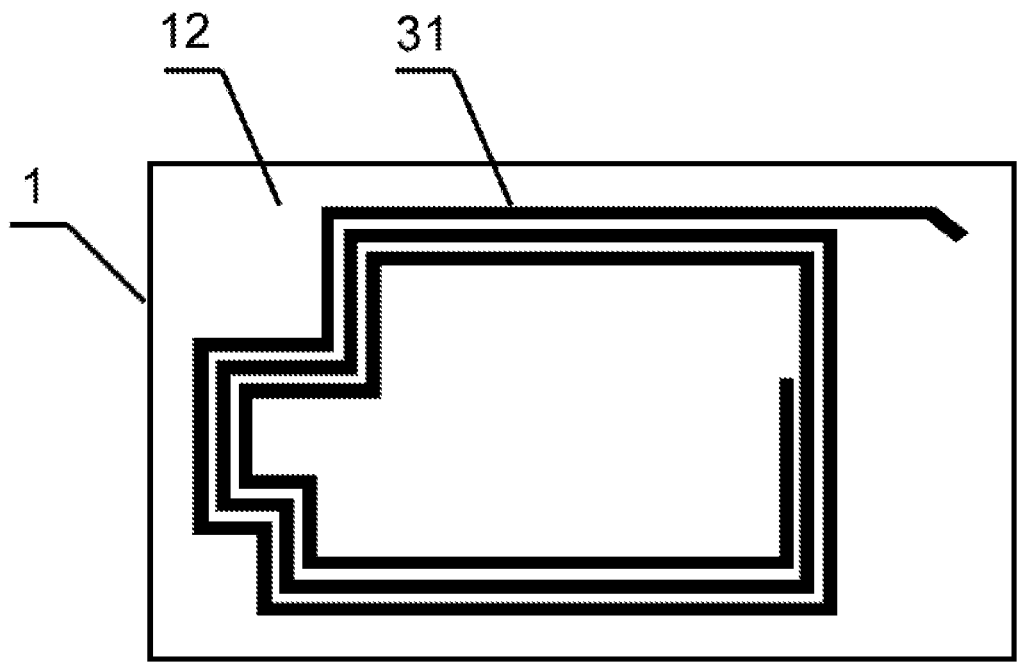
FIG. 3 is the schematic diagram showing the second face of the first dielectric layer of the isolated coupling structure.

In an embodiment of the present invention, an isolated coupling structure used for signal transmission, as shown in FIG. 2 and FIG. 3, includes a first dielectric layer 1 having a first face 11 and a second face 12 opposite to the first face, a first coupling coil 2 formed on the first face 11 surrounding the edges of the first dielectric layer 1 forming an internal area on the first face 11; and a second coupling coil 3 configured to create mutual inductance with the first coupling coil 2. The second coupling coil 3 includes a first coil part 31 and a second coil part 32, in which the first coil part 31 is formed on the second face 12, and the second coil part 32 is formed on the first face 11 inside the internal area of the first coupling coil 2 and is isolated from the first coupling coil 2. The first coil part 31 is electrically connected to the second coil part 32.

Figure 1:
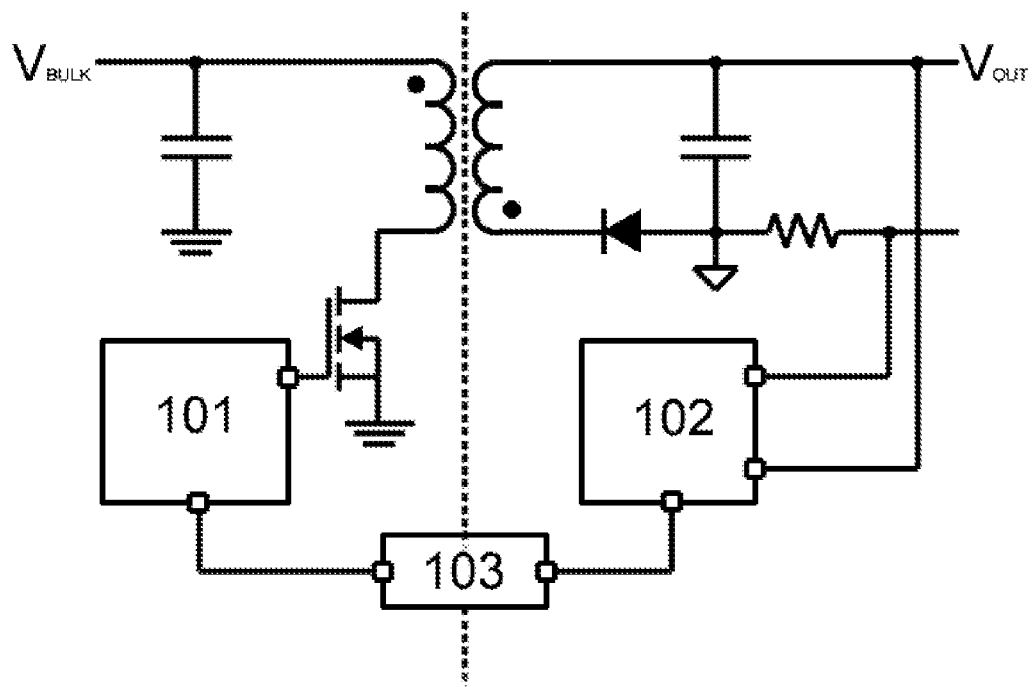
FIG. 1 is a schematic structural diagram of the AC-DC converter using a secondary side regulation scheme of the prior art.

As shown in FIG. 1, the isolated coupling structure of the prior art can serve as the coupling element for transmitting control signal between the second controller 102 and the first controller 101 on the AC-DC converter regulated by the secondary side. In the present invention, the second coupling coil 3 can be electrically connected to the second controller 102 at both ends to serve as the primary coil of the coupling element, and the first coupling coil 2 can be electrically connected to the first controller 101 at both ends to serve as the secondary coil of the coupling element. When the second controller 102 transmits control signal to the first controller 101, by changing the voltages across the second coupling coil 3, an induced electromotive force is generated in the first coupling coil 2 creating mutual inductance with the second coupling coil 3, thus transmitting the control signal from the second controller 102 to the first controller 101. When the second controller 102 makes the voltages across the second coupling coil 3 disappear, the induced electromotive force in the first coupling coil 2 also disappears, thus achieving fast isolation. The connection modes between the first coupling coil 2 and the second coupling coil 3 and between the first controller 101 and the second controller 102 are only used to explain the feasibility of the above embodiment, and do not limit the scope of protection of the present invention.

Figure 4:
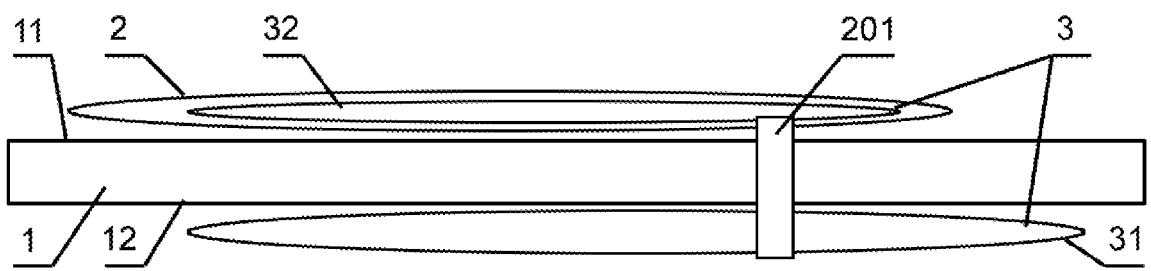
FIG. 4 is the schematic structural diagram showing the side view of the isolated coupling structure having the first through via connecting the first coil part and the second coil part.
Figure 5:
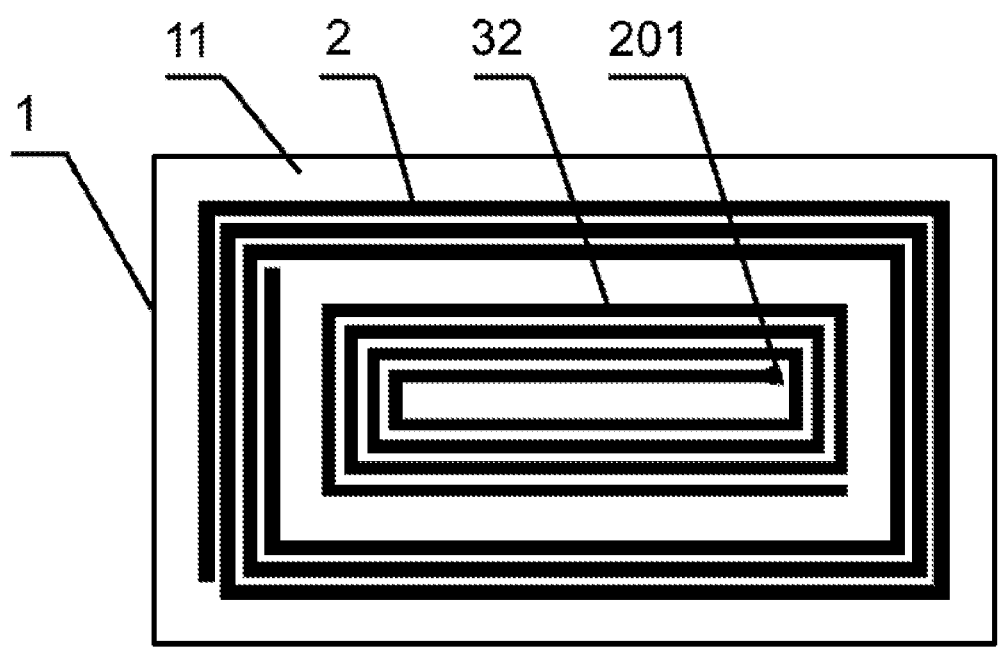
FIG. 5 is the schematic structural diagram showing the first face of the isolated coupling structure having the first through via connecting the first coil part and the second coil part.
Figure 6:
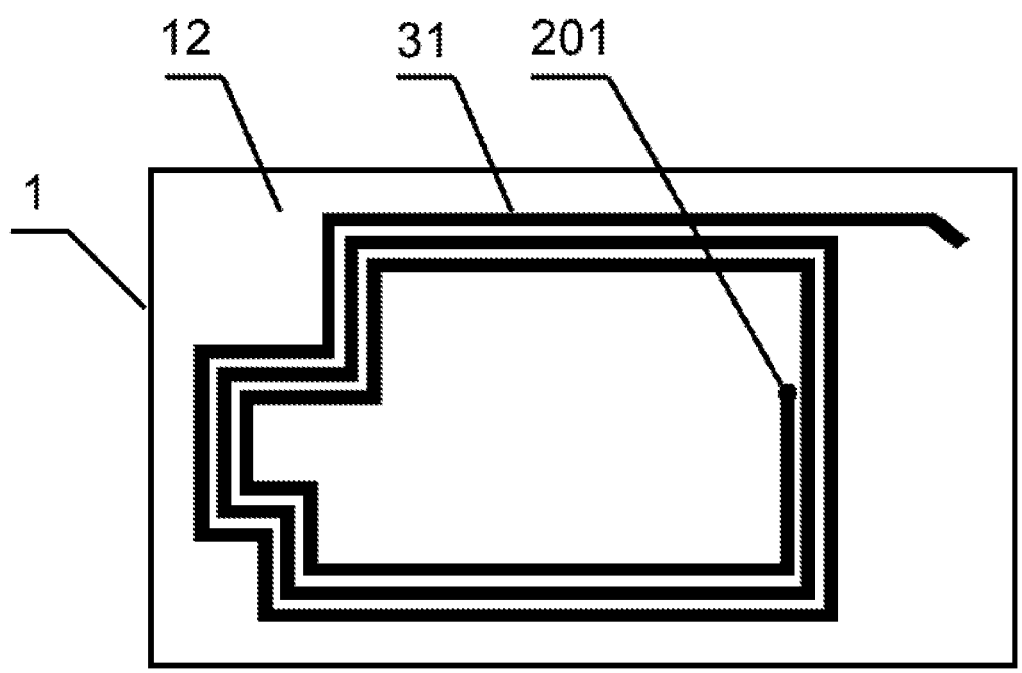
FIG. 6 is the schematic structural diagram showing the second face of the isolated coupling structure having the first through via connecting the first coil part and the second coil part.

Based on the above-mentioned technical scheme, as shown in FIG. 4, the first coil part 31 and the second coil part 32 can be connected by a first through via 201 on the first dielectric layer 1. Using a through via to connect conductive structures on both sides of a dielectric layer is a technical scheme commonly used in this field, and thus will not be described any further. As shown in FIG. 5 and FIG. 6, the first through via 201 is located inside the area enclosed by the second coil part 32 on the first face 11 and inside the area enclosed by the first coil part 31 on the second face 12, as such it does not occupy any additional area of the first dielectric layer 1 or affect the package dimensions of the isolated coupling structure. Furthermore, the second coil part 32 of the second coupling coil 3 is formed on the same face with the first coupling coil 2, as such the second coupling coil 3 is formed on both sides of the first dielectric layer 1 and thus reducing the area of the first dielectric layer 1.

In the present invention, the first coupling coil 2 and the second coupling coil 3 can be configured with different numbers of turns, so that, when the first coupling coil 2 and the second coupling coil 3 create a mutual inductance for transmitting control signal, the voltage conversion of control signal can be achieved with the first controller and the second controller having different input levels to achieve level matching. The specific value of voltage conversion can be confirmed according to the actual service environment, and the confirmed voltage conversion value can be used as a basis to configure related numbers of turns for the first coupling coil 2 and the second coupling coil 3. In this embodiment, the number of turns for the second coupling coil 3, including the first coil part 31 and second coil part 32, can be greater than that for the first coupling coil 2. The first coil part 31 and the second coil part 32 are formed on two opposite sides of the first dielectric layer 1, where the second coil part 32 is formed on the same face with the first coupling coil 2, so as to reduce the area occupied by the isolated coupling structure on the first dielectric layer 1 resulting the isolated coupling structure with relatively small package dimensions.

In an embodiment, the first dielectric layer 1 may be a printed circuit board, and the first coupling coil 2 and the second coupling coil 3 can be formed at the same time with the conductive layers on the printed circuit board in the form of a planar coil, achieving low-cost coupling elements. Specifically, the first coupling coil 2 and the second coil part 32 are required to have enclosed shapes, such as rectangular, circular, oval and the likes. As shown in FIG. 2, the first coupling coil 2 and the second coil part 32 both are rectangular shapes, which makes more convenient for forming conductive layer by the etching process, thus further reducing the cost of coupling elements. The conductive layer preferably is made of copper.

In an embodiment, the first coupling coil 2 and the second coupling coil 3 need to operate at different voltages, as such it's necessary to provide a sufficient dielectric capability between the first coupling coil 2 and the second coupling coil 3 on the isolated coupling structure improving the high voltage withstand capacity of the first coupling coil 2 and the second coupling coil 3 during the operation. Furthermore, distances between the first coupling coil 2 and the second coupling coil 3 in any direction may be set to be greater than or equal to a first predetermined distance, which is a distance through insulation (DTI) (DTI is the smallest distance between two conductors of different potentials isolated by an insulator and the charge between conductors won't pass through the insulator if its thickness is greater than or equal to the DTI). The second coupling coil 3 includes the first coil part 31 and the second coil part 32 and the first coupling coil 2 and the second coil part 32 are located on the same face, thus the distances between the second coil part 32 and the first coupling coil 2 in any direction can be set to be greater than or preferably equal to the first predetermined distance for the demands of both package dimensions and dielectric capability. On this basis, the distances between the first coupling coil 2 and the edge of the first dielectric layer 1 in any direction can be set to be greater than or preferably equal to the first predetermined distance for the demands of both package dimensions and dielectric capability. Similarly, the thickness of the first dielectric layer 1 may be set to be greater than or preferably equal to a first predetermined distance, so that the vertical distances between the first coupling coil 2 and the second coil part 32 on the first face 11 and the first coil part 31 on the second face 12 will be greater than or equal to the first predetermined distance. Further, the first coupling coil 2 and the second coupling coil 3 are formed on two opposite faces of the first dielectric layer 1 in the form of planar coils, and their trace pitch are limited by the minimum distance at which the production capacity can be achieved. For example, the trace pitch of the first coupling coil 2 and second coupling coil 3 can be set to be 0.1 mm.

In another embodiment, if the first dielectric layer 1 is made of FR-4 material and the first predetermined distance is set to be equal to 0.5 mm, in the high potential (or high voltage) insulation test (also referred to as dielectric withstanding voltage test), the isolated coupling structure will be able to withstand a high voltage of 10 kV without being damaged. Furthermore, considering package dimensions and reducing voltage-withstand requirements, when the first dielectric layer 1 is made of FR-4 material and the first predetermined distance is set to be equal to 0.4 mm, the isolated coupling structure can withstand a high voltage of 8 kV without being damaged.

Figure 7:
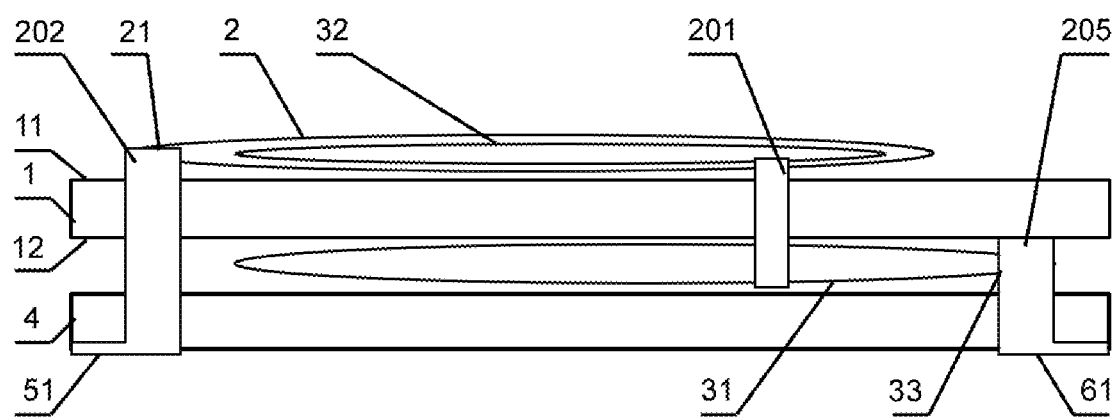
FIG. 7 is the schematic structural diagram showing the side view of the isolated coupling structure having first and second dielectric layers of the present invention.

In another embodiment shown in FIG. 7, the isolated coupling structure of FIGS. 2-6 further includes a second dielectric layer 4 formed on the second face 12 of the first dielectric layer 1, so that the first coil part 31 is located between the first dielectric layer 1 and second dielectric layer 4 and thus providing the first coil part 31 a better resistance to humidity. The isolated coupling structure also includes a first pad set 50, consisting of a first bonding pad 51 and a second bonding pad 52, formed on one side of the second dielectric layer 4 facing away from the first dielectric layer 1, where the first bonding pad 51 and the second bonding pad 52 are electrically connected to two ends of the first coupling coil 2 respectively. As such, the first coupling coil 2 electrically connects with the first controller 101 by the first bonding pad 51 and the second bonding pad 52 in the first pad set 50 and the further connecting with conductors. The isolated coupling structure further includes a second pad set 60, which consists of a third bonding pad 61 and a fourth bonding pad 62, formed on one side of the second dielectric layer 4 facing away from the first dielectric layer 1, where the third bonding pad 61 and the fourth bonding pad 62 are electrically connected to two ends of the second coupling coil 3 respectively. As such, the second coupling coil 3 electrically connects with the second controller 102 by the third bonding pad 61 and the fourth bonding pad 62 in the second pad set 60 and the further connecting with conductors. For the sake of the simplicity, the second bonding pad 52 and the fourth bonding pad 62 are not shown in FIG. 7. The isolated coupling structure thus can be conveniently connected between the first controller 101 and the second controller 102 by the first pad set 50 and the second pad set 60.

Figure 8:
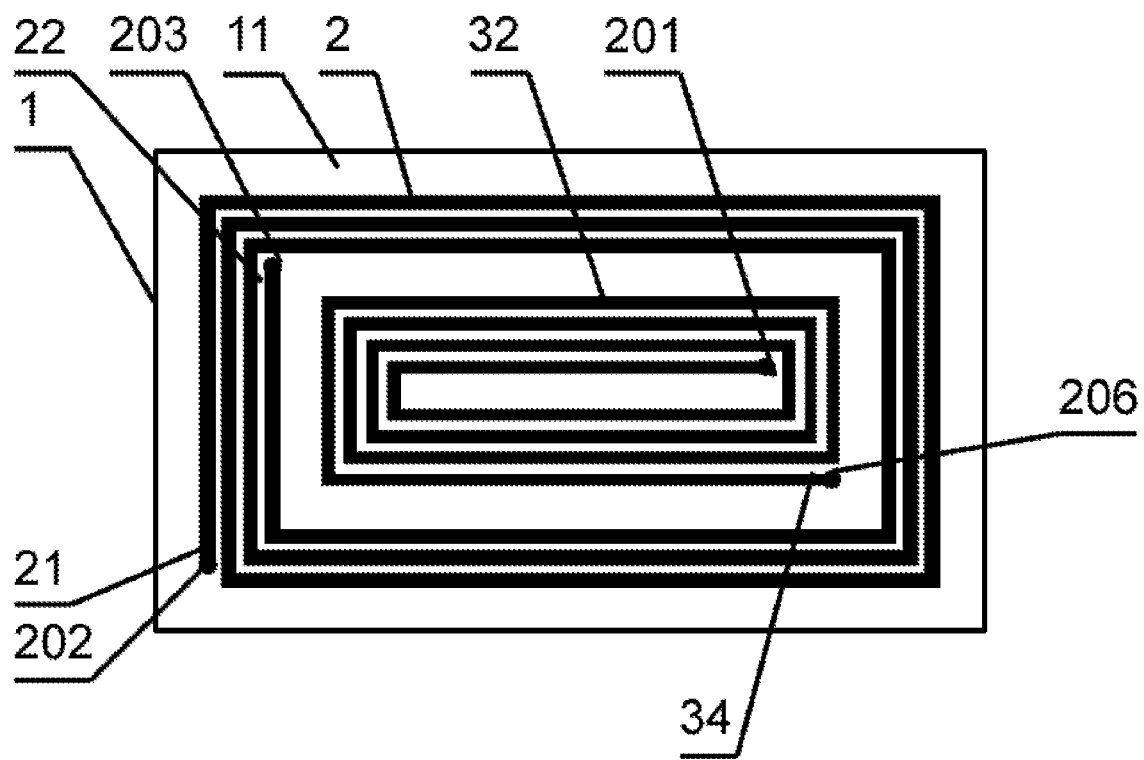
FIG. 8 is the schematic structural diagram showing the first face of the isolated coupling structure having first and second dielectric layers.
Figure 9:
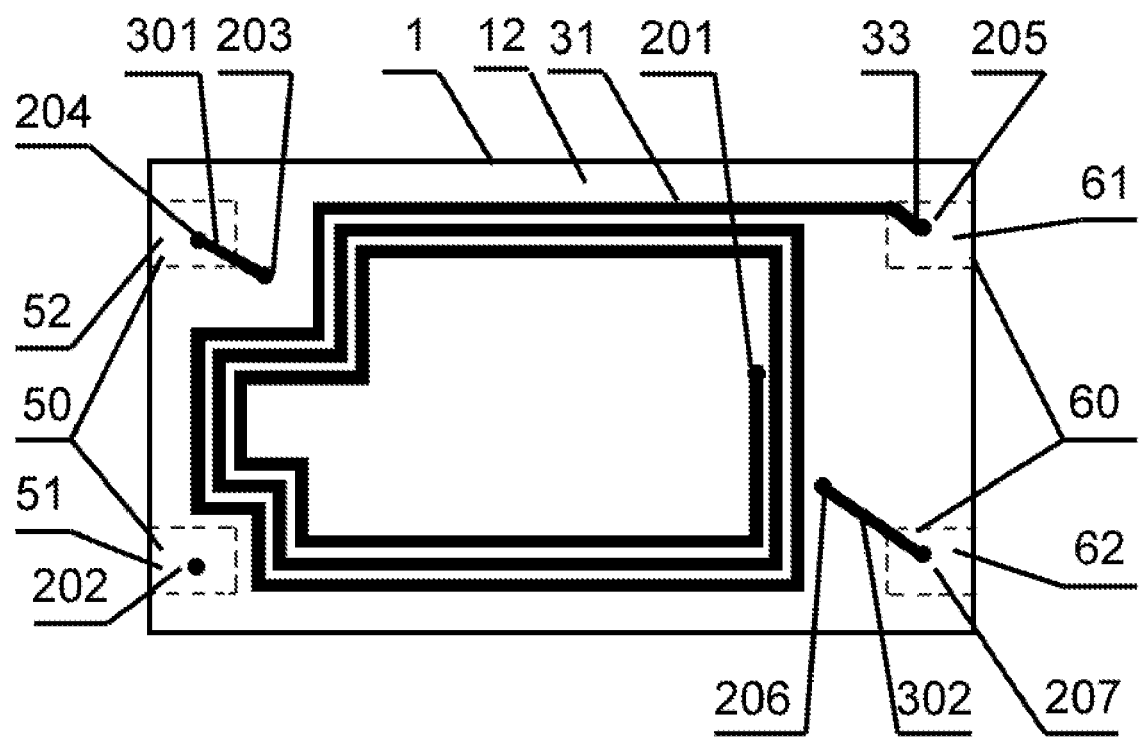
FIG. 9 is the schematic structural diagram showing the second face of the isolated coupling structure shown in FIG. 8.
Figure 10:
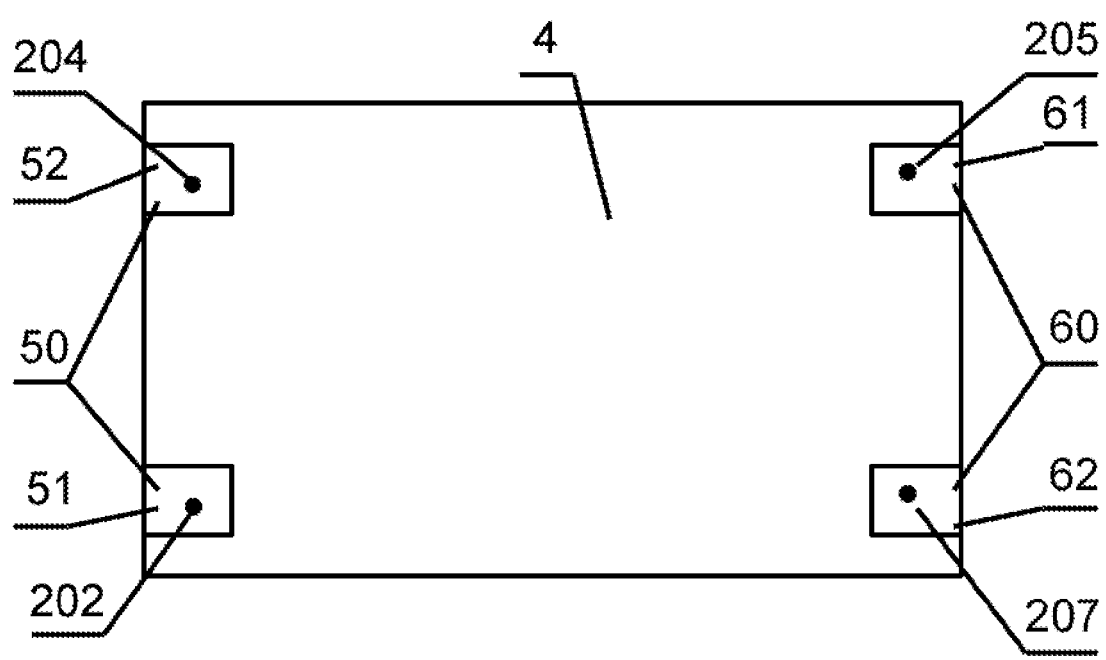
FIG. 10 is the structural diagram showing the bottom face of the second dielectric layer of the isolated coupling structure shown in FIG. 8.

In this embodiment, the thickness of the second dielectric layer 4 can be set to be greater than or preferably equal to the first predetermined distance according to the dielectric capability. As shown in FIG. 7, one end of the first coupling coil 2 includes a first outer ring joint 21 electrically connecting to the first bonding pad 51 by a second through via 202 penetrating the first dielectric layer 1 and the second dielectric layer 4. The distances between the second through via 202 and the edges of the first dielectric layer 1 in any direction can be set to be greater than or preferably equal to the first predetermined distance. The distances between the second through via 202 and the first coil part 31 in any direction can be set to be greater than or preferably equal to the first predetermined distance. Furthermore, as shown in FIG. 8, the other end of the first coupling coil 2 includes a first inner ring joint 22. As shown in FIG. 9, a first metal line 301 is formed on the second face 12, where one end of the first metal line 301 is electrically connected to the first inner ring joint 22 by a third through via 203 penetrating the first dielectric layer 1 and the other end is electrically connected to the second bonding pad 52 by a fourth through via 204 penetrating the second dielectric layer 4. The first metal line 301 is electrically connected to the first coupling coil 2, thus has the same voltage as the first coupling coil 2 when the control signal is transmitted. The first metal line 301 can be placed outside the area enclosed by the first coil part 31, preferably, the first coil part 31 (in one example, the first coil part 31 is planar) can be set with an corner at a site adjacent to the first metal line 301 as shown in FIG. 9. The distances between the third through via 203 and the first coil part 31 in any direction can be set to be greater than or preferably equal to the first predetermined distance, thus the distances between the first metal line 301 and the first coil part 31 in any direction can be set to be greater than or preferably equal to the first predetermined distance. Similarly, the distances between the fourth through via 204 and the first dielectric layer 1 in any direction can be set to be greater than or preferably equal to the first predetermined distance. Furthermore, one end of the first coil part 31 of the second coupling coil 3 includes a second outer ring joint 33 electrically connected to third bonding pad 61 by a fifth through via 205 penetrating the second dielectric layer 4. One end of the second coil part 32 of the second coupling coil 3 includes a second inner ring joint 34. A second metal line 302 is also formed on the second face 12 with one end electrically connected to the second inner ring joint 34 by a sixth through via 206 penetrating the first dielectric layer 1 and the other end electrically connected to the fourth bonding pad 62 by a seventh through via 207 penetrating the second dielectric layer 4. The second metal line 302 is located outside the area enclosed by the first coil part 31. As such, the second metal line 302 (in one example, the second metal line 302 may be a bonding wire), the fifth through via 205, the sixth through via 206 and the seventh through via 207 have the same voltage as the first coil part 31 when the control signal is transmitted. When the predetermined distance satisfies the basic of dielectric capability, the requirement for package dimensions may be achieved. The first dielectric layer 1 can be rectangular shape, and the second dielectric layer 4 and the first dielectric layer 1 may have the same shape and overlap at the edge. The first bonding pad 51 and the second bonding pad 52 are both rectangular, located adjacent to one short side of the first dielectric layer 1 and separated by a second predetermined distance, where one short side of the first bonding pad 51 and one short side of the second bonding pad 52 are overlapped with the short side of the first dielectric layer 1. The third bonding pad 61 and the fourth bonding pad 62 are both rectangular and located near another short side of the first dielectric layer 1 and separated by the same second predetermined distance, where one short side of the third bonding pad 61 and one short side of the fourth bonding pad 62 are overlapped with the short side of the first dielectric layer 1. The first bonding pad 51 and the second bonding pad 52 of the first pad set 50 are attached to one short side of the rectangle corresponding to the second dielectric layer 4, and the third bonding pad 61 and the fourth bonding pad 62 of the second pad set 60 are attached to another short side of the rectangle corresponding to the second dielectric layer 4, so that the first pad set 50 and the second pad set 60 occupy a small package area of the isolated coupling structure and thus the area of the first coupling coil 2 and the second coupling coil 3 is increased.

In one example, when the first predetermined distance is set as 0.5 mm the second predetermined distance can be set as 3 mm. On this basis, the length and width of the first dielectric layer 1 can be set as 9.5 mm and 5.5 mm respectively, the length and width of the first bonding pad 51 can be set as 1 mm and 0.75 mm, respectively. Furthermore, the length and width of the second bonding pad 52 can be set as 1 mm and 0.75 mm respectively, the length and width of the third bonding pad 61 can be set as 1 mm and 0.75 mm, respectively, and the length and width of the fourth bonding pad 62 can be set as 1 mm and 0.75 mm respectively.

Furthermore, vertical distances between the first and second bonding pads 51, 52 and the adjacent long side of the first dielectric layer 1 can be set same as the first predetermined distance, and the vertical distance between the third and fourth pads 61, 62 and the adjacent long side of the first dielectric layer 1 also can be set same as the first predetermined distance. When the first predetermined distance is set as 0.4 mm, the second predetermined distance, the length and width of the first dielectric layer 1 and the length and width of each pad can all be re-determined according to the actual demands for package dimensions.

Figure 11:
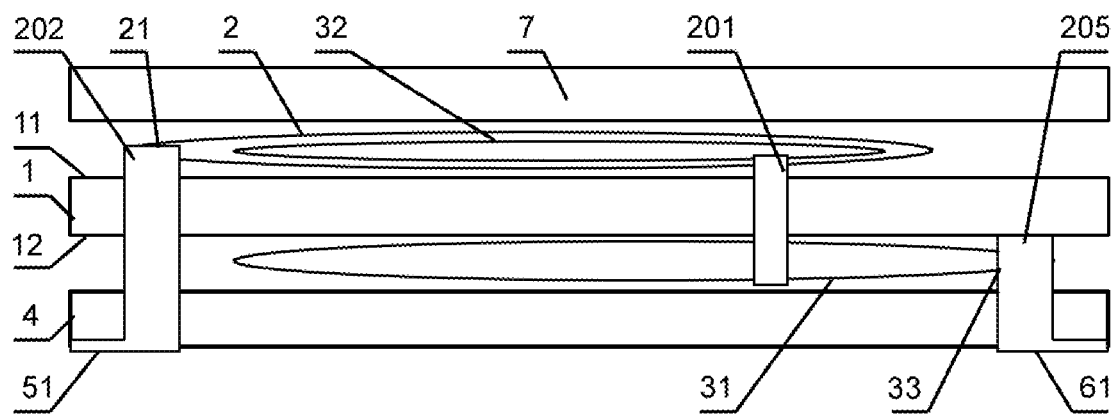
FIG. 11 is the schematic structural diagram showing the side view of the isolated coupling structure having first, second and third dielectric layers of the present invention.

In another embodiment, as shown in FIG. 11, the isolated coupling structure of FIGS. 7-10 also includes a third dielectric layer 7 covering the first face 11 of the first dielectric layer 1, so that the first coupling coil 2 and the second coil part 32 are located between the first dielectric layer 1 and the third dielectric layer 7 and thus providing the first coupling coil 2 and the second coil part 32 a better resistance to humidity. The thickness of the third dielectric layer 7 can be set to be greater than or preferably equal to the first predetermined distance.

Figure 12:
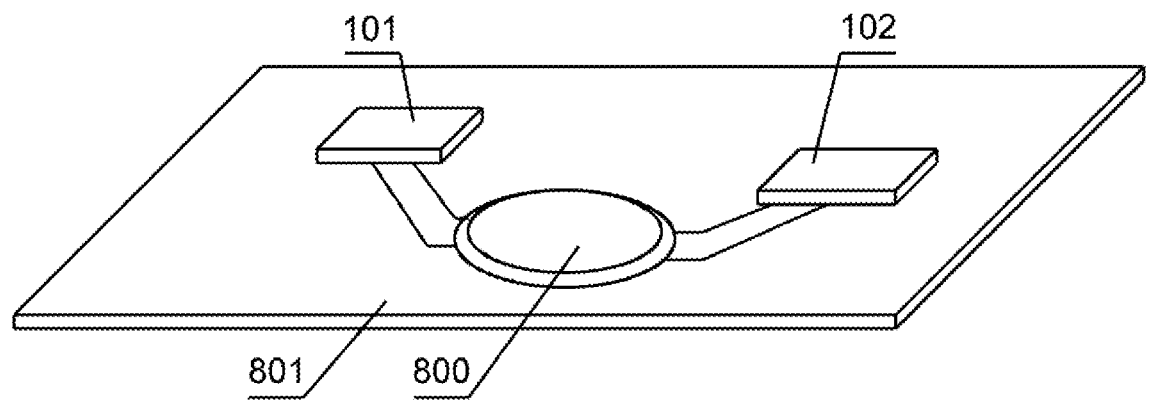
FIG. 12 is the schematic structural diagram showing the isolated coupling device connecting to a system circuit board of the present invention.

In another embodiment of the present invention shown in FIG. 12, an isolated coupling device 800 includes the above-mentioned isolated coupling structure formed on a separate system printed circuit board (PCB) as a standalone inductive isolator device by a chip-on-board (COB) process. Two ends of the first coupling coil 2 and the two ends of the second coupling coil 3 of the isolated coupling device 800 are respectively connected to the printed circuit board 801 by separate pins. Specifically, the pins connect to the first controller 101 via the first pad set 50 and other pins connect to the second controller 102 via the second pad set 60; or the pins connects the first controller 101 via the second pad set 60 and other pins connect the second controller 102 via the first pad set 50. The pins can be patch-type pins, in-line pins, or ball grid array package pins with spherical solders.

Figure 13:
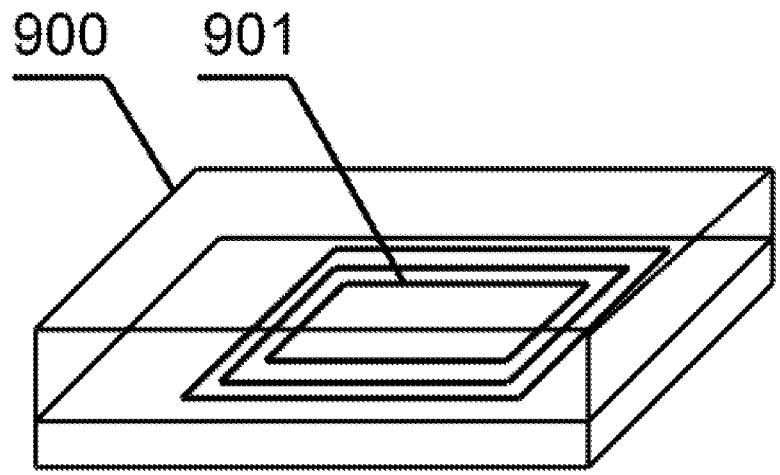
FIG. 13 is the perspective schematic structural diagram of the isolated coupling element.

As shown in FIG. 13, an isolated coupling element 900 includes the above-mentioned isolated coupling structure 901, where the isolated coupling structure 901 is packaged into a package. Two ends of the first coupling coil 2 and the two ends of the second coupling coil 3 of the isolated coupling structure 901 in the isolated coupling element 900 are respectively connected to the system printed circuit board by separate pins. Specifically, the isolated coupling structure 901 is packaged like a semiconductor chip forming an individual isolated coupling element 900 and can be installed on various devices.

Figure 14:
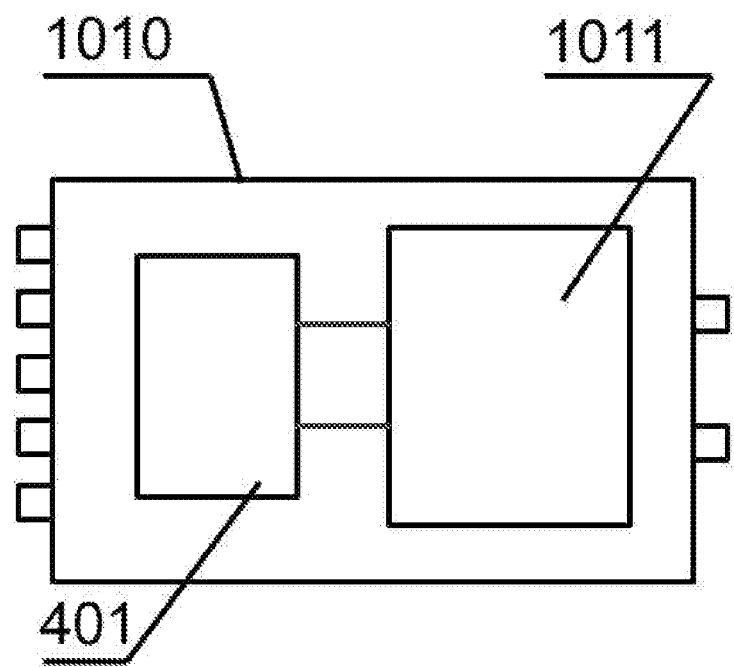
FIG. 14 is the schematic structural diagram of a chip package of the present invention.

In another embodiment shown in FIG. 14, a chip package 1010 includes the above-mentioned isolated coupling structure 1011 and at least one semiconductor chip 401 electrically connected to the two ends of the first coupling coil 2 or with two ends of the second coupling coil 3 of isolated coupling structure 1011, where the isolated coupling structure 1011 and the semiconductor chip 401 are co-packaged into one chip package. The semiconductor chip 401 can be the first controller 101 connected to the two ends of the first coupling coil 2. The semiconductor chip 401 can also be the second controller 102 connected to the two ends of the second coupling coil 3. The individual chip package 1010 including at least one of the first controller 101 and the second controller 102 together with the isolated coupling structure 1011 can be easily used as secondary side regulation scheme for the AC-DC converter on the system printed circuit board.

Figure 15:
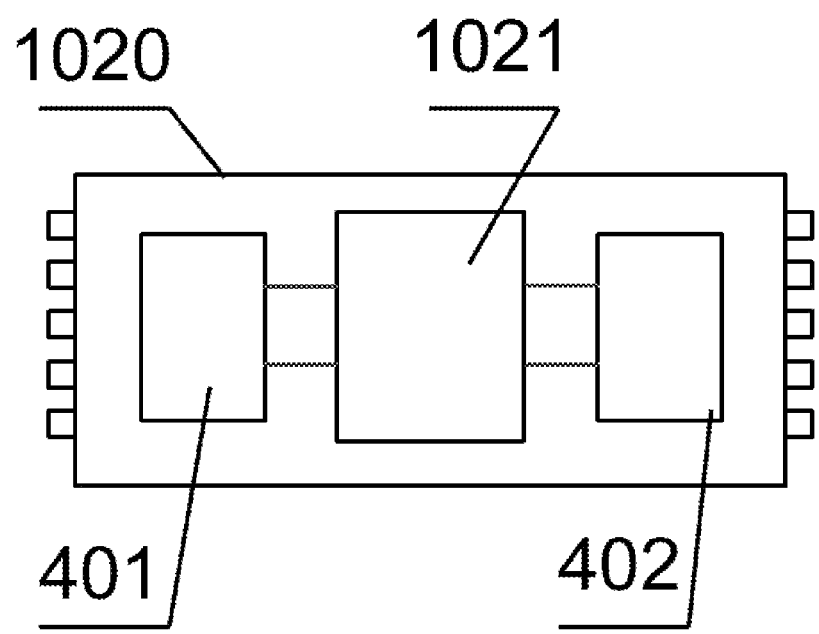
FIG. 15 is the schematic structural diagram of another chip package of the present invention.

As shown in FIG. 15, a chip package 1020 includes the above-mentioned isolated coupling structure 1021, a first semiconductor chip 401 electrically connected to two ends of the first coupling coil 2 of the isolated coupling structure 1021, a second semiconductor chip 402 electrically connected to two ends of the second coupling coil 3 of the isolated coupling structure 1021, where the isolated coupling structure 1021, the first semiconductor chip 401 and the second semiconductor chip 402 are co-packaged into one chip package. The first semiconductor chip 401 can be the first controller 101, and the second semiconductor chip 402 can be the second controller 102. The chip package 1020 with the first controller 101, the second controller 102 and the isolated coupling structure 1021 can be easily used as the secondary side regulation scheme for the AC-DC converter on the system printed circuit board.

Figure 16:
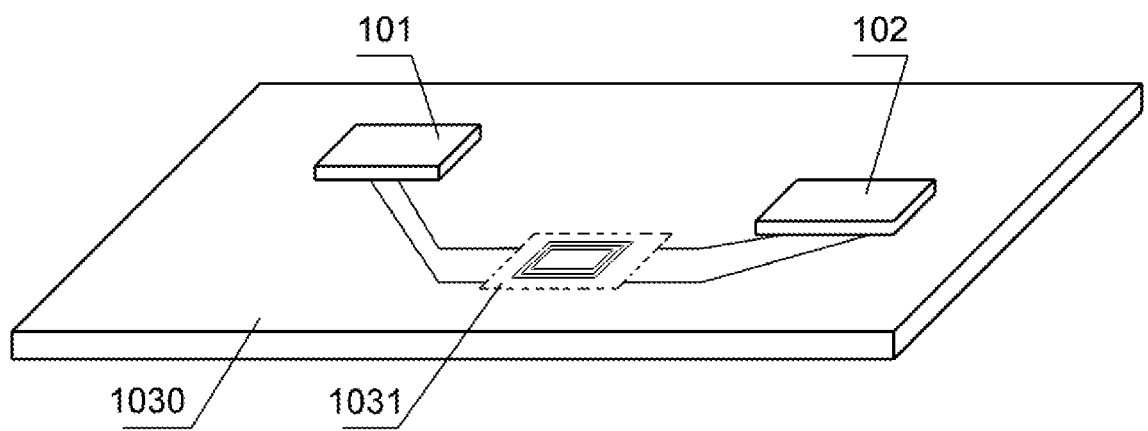
FIG. 16 is the schematic structural diagram of the printed circuit board of the present invention.

In another embodiment shown in FIG. 16, a printed circuit board 1030 also includes the above-mentioned isolated coupling structure 1031 integrated as a part of the printed circuit board 1030. By directly integrating the isolated coupling structure 1031 into the system circuit board, the first coupling coil 2 and the second coupling coil 3 are formed at the same time with the conductive layers of the system printed circuit board, thus further reducing the cost of the coupling structure.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. An isolated coupling structure used for signal transmission, the isolated coupling structure comprising:
   a first dielectric layer comprising a first face and a second face opposite to the first face;
   a first coupling coil formed on the first face surrounding an internal area of the first dielectric layer on the first face; and
   a second coupling coil configured to create a mutual inductance with the first coupling coil;
   wherein the second coupling coil comprises a first coil part and a second coil part electrically connecting to the first coil part;
   wherein the first coil part is formed on the second face;
   wherein the second coil part is formed on the first face and is located within the internal area and is isolated from the first coupling coil;
   wherein a first end of the second coil part connects to a first through via located within the internal area;
   wherein a second end of the second coil part connects to a second inner ring joint located within the internal area;
   wherein the isolated coupling structure further comprises
      a second dielectric layer on the second face of the first dielectric layer; wherein the first coil part is located between the first dielectric layer and the second dielectric layer;
      a first pad set comprising a first pad and a second pad; wherein the first pad set is formed on a face of the second dielectric layer facing away from the first dielectric layer; and wherein the first pad and the second pad are electrically connected to first and second ends of the first coupling coil, respectively; and
      a second pad set comprising a third pad and a fourth pad, wherein the second pad set is formed on the face of the second dielectric layer facing away from the first dielectric layer; and wherein the third pad and the fourth pad are electrically connected to first and second ends of the second coupling coil respectively;
   wherein the first end of the second coupling coil includes a second outer ring joint located at an end of the first coil part;

wherein the third pad is electrically connected to the second outer ring joint by a fifth through via penetrating the second dielectric layer;

wherein the second end of the second coupling coil includes the second inner ring joint located at the second end of the second coil part;

wherein a second metal line formed on the second face having a first end connected to the second inner ring joint by a sixth through via penetrating the first dielectric layer; and wherein a second end of the second metal line is electrically connected to the fourth pad by a seventh through via penetrating the second dielectric layer.

2. The isolated coupling structure of claim 1, wherein the first coil part and the second coil part are connected together by the first through via penetrating the first dielectric layer.

3. The isolated coupling structure of claim 2, wherein the first through via is located within an area enclosed by the second coil part on the first face; and wherein the first through via is located within an area enclosed by the first coil part on the second face.

4. The isolated coupling structure of claim 1, wherein a shortest distance between the second coil part and the first coupling coil is greater than or equal to a first predetermined distance; a shortest distance between the first coupling coil and edges of the first dielectric layer is greater than or equal to the first predetermined distance; a thickness of the first dielectric layer is greater than or equal to the first predetermined distance.

5. The isolated coupling structure of claim 1, wherein the first coil part and the second coil part are connected together by a first through via penetrating the first dielectric layer; and wherein a thickness of the second dielectric layer is greater than or equal to a first predetermined distance; a shortest distance between a second through via and edges of the first dielectric layer is greater than or equal to the first predetermined distance; a shortest distance between the second through via and the first coil part is greater than or equal to the first predetermined distance.

6. The isolated coupling structure of claim 1, wherein the second metal line is located outside an area enclosed by the first coil part.

7. The isolated coupling structure of claim 1, wherein the first dielectric layer, the second dielectric layer, the first coil and the second coil are provided in a discrete package substantially in rectangular shape.

8. The isolated coupling structure of claim 7, wherein a minimum distance between the first pad and the second pad is greater than a first predetermined distance;

wherein a minimum distance between the second pad and the third pad is greater than the first predetermined distance;

wherein a minimum distance between the third pad and the fourth pad is greater than the first predetermined distance; and wherein a minimum distance between the fourth pad and the first pad is greater than the first predetermined distance.

9. The isolated coupling structure of claim 1, further comprising:

a third dielectric layer overlaying the first face, wherein the first coupling coil and the second coil part are located between the first dielectric layer and the third dielectric layer.

10. The isolated coupling structure of claim 1, wherein the first dielectric layer is a printed circuit board, and the first coupling coil and the second coupling coil are formed with conductive layers on the printed circuit board.

11. The isolated coupling structure of claim 10, wherein a minimum distance between a first pad and a second pad is greater than a first predetermined distance;

wherein a minimum distance between the second pad and a third pad is greater than the first predetermined distance;

wherein a minimum distance between the third pad and a fourth pad is greater than the first predetermined distance; and wherein a minimum distance between the fourth pad and the first pad is greater than the first predetermined distance; and wherein the first predetermined distance is a safe distance through insulation (DTI).

12. An isolated coupling structure used for signal transmission, the isolated coupling structure comprising:

a first dielectric layer comprising a first face and a second face opposite to the first face;

a first coupling coil formed on the first face surrounding an internal area of the first dielectric layer on the first face;

a second coupling coil configured to create a mutual inductance with the first coupling coil;

a second dielectric layer on the second face of the first dielectric layer;

a first pad set comprising a first pad and a second pad; and a second pad set comprising a third pad and a fourth pad;

wherein the second coupling coil comprises a first coil part and a second coil part electrically connecting to the first coil part;

wherein the first coil part is formed on the second face;

wherein the second coil part is formed on the first face and is located within the internal area and is isolated from the first coupling coil;

wherein the first coil part is located between the first dielectric layer and the second dielectric layer;

wherein the first pad set is formed on a face of the second dielectric layer facing away from the first dielectric layer;

wherein the first pad and the second pad are electrically connected to first and second ends of the first coupling coil, respectively;

wherein the second pad set is formed on the face of the second dielectric layer facing away from the first dielectric layer;

wherein the third pad and the fourth pad are electrically connected to first and second ends of the second coupling coil respectively;

wherein the first coil part and the second coil part are connected together by a first through via penetrating the first dielectric layer;

wherein the first end of the first coupling coil includes a first outer ring joint; and wherein the first pad is electrically connected to the first outer ring joint by a second through via successively penetrating the first dielectric layer and the second dielectric layer.

13. The isolated coupling structure of claim 12, wherein the second end of the first coupling coil include a first inner ring joint;

a first metal line formed on the second face having a first end connected to the first inner ring joint by a third through via penetrating the first dielectric layer, a second end of the first metal line is electrically connected to the second pad by a fourth through via penetrating the second dielectric layer.

14. The isolated coupling structure of claim 13, wherein the first metal line is located outside an area enclosed by the first coil part.

15. The isolated coupling structure of claim 13, wherein a shortest distance between the third through via and the first coil part is greater than or equal to a first predetermined distance;
- a shortest distance between the third through via and the first coil part is greater than or equal to the first predetermined distance; and
- a shortest distance between the first metal line and the first coil part is greater than or equal to the first predetermined distance.

16. The isolated coupling structure of claim 13, wherein a shortest distance between the fourth through via and edges of the first dielectric layer is greater than or equal to a first predetermined distance.

* * * * *